United States Patent

Dohle et al.

[11] Patent Number: 5,920,584
[45] Date of Patent: Jul. 6, 1999

[54] HIGH-POWER DIODE LASER AND METHOD FOR MOUNTING THE SAME

[75] Inventors: Rainer Dohle, Dresden; Stefan Heinemann; Dirk Lorenzen, both of Jena; Friedhelm Dorsch, Wiesbaden; Franz Daiminger, Weimar, all of Germany

[73] Assignee: Jenoptik Aktiengesellschaft, Jena, Germany

[21] Appl. No.: 08/956,888

[22] Filed: Oct. 23, 1997

[30] Foreign Application Priority Data

Oct. 29, 1996 [DE] Germany ............ 196 44 941

[51] Int. Cl.⁶ .................. H01S 3/04; H01L 21/20
[52] U.S. Cl. ................................. 372/36; 438/33
[58] Field of Search .................. 372/36, 29, 31, 372/43; 438/33

[56] References Cited

U.S. PATENT DOCUMENTS

| | | | |
|---|---|---|---|
| 3,946,334 | 3/1976 | Yonezu et al. | 372/36 |
| 4,161,701 | 7/1979 | Takeda et al. | 372/36 |
| 4,672,736 | 6/1987 | Westermeier | 438/33 |
| 4,887,736 | 12/1989 | Romano | 257/796 |
| 4,904,617 | 2/1990 | Muschke | 438/33 |

FOREIGN PATENT DOCUMENTS 37 31 312  3/1989  Germany .

*Primary Examiner*—Rodney Bovernick
*Assistant Examiner*—Quyen Phan Leung
*Attorney, Agent, or Firm*—McAulay Nissen Goldberg Kiel & Hand, LLP

[57] ABSTRACT

A high-power diode laser and a method for mounting same are described. Predetermined breaking locations in the laser bar are provided which, during cooling after the laser bar has been soldered to a heat sink having a smaller thermal expansion coefficient, lead to breakage at defined locations between the single laser diodes of the laser bar. As a result of the physical division of the laser bar, it is possible to use a solder which has low ductility (hard solder) at room temperature, since destruction of the single laser diodes of the laser bar as a result of mechanical stresses can be ruled out.

18 Claims, 1 Drawing Sheet

HIGH-POWER DIODE LASER AND METHOD FOR MOUNTING THE SAME

BACKGROUND OF THE INVENTION a) Field of the Invention

In order to mount or assemble high-power diode lasers, it is known to solder laser bars to a heat sink having a thermal expansion coefficient which differs sharply from that of the laser bar by means of soft solder, e.g., an indium-containing solder or tin-lead solder. (1) (2) (see list of citations at end).

By laser bar is meant a strip of semiconductor material with a typical width of 10 mm which is divided, e.g., by V-grooves, as they are called, into single laser diodes which act optically and electrically like an arrangement of a plurality of parallel-connected individual laser diodes, but which are physically separated from one another. Accordingly, the expression "individual laser diodes" [Einzellaserdioden] will be understood hereinafter as laser diodes which are physically separated from one another, while "the single laser diodes of a bar" [einzelnen Laserdioden eines Barrens] refers to laser diodes which are physically connected with one another. Laser bars as a side with p-doping (p-side) where the active regions are located. The opposite side of the laser bar is designated as the n-side. By laser diodes are meant components with a so-called "broad area" or an array structure, as it is called, which emit laser light. By high-power diode laser is meant the entire arrangement comprising a laser bar, a heat sink, and the bonding of the n-side of the laser bar which is realized, e.g., by means of a soldered cover or by wire bonds.

b) Description of the Related Art

In the known mounting process, occurring as a result of the different thermal expansion coefficients of the laser bar and heat sink during the soldering process are compensated by the plastic flux of the soft solder. (1)

A disadvantage herein consists especially in the ageing of the solder location due to formation of intermetallic phases, whisker growth, and strong electromigration at the very high current densities which occur. (3) (7) With respect to long-term behavior, this leads to a deterioration of electrooptical characteristics and to a limiting of the life of such high-power diode lasers to a few thousand hours.

These disadvantages can be prevented through the use of a gold-tin solder which has low ductility at room temperature. However, as is reported in the literature, the use of such solder achieves only an insufficient compensation of mechanical stresses (4), which results in the destruction (5) of the semiconductor material or in accelerated degradation of the high-power diode laser (3).

In fact, when laser bars were soldered during tests to heat sinks having a substantially lower thermal expansion coefficient than the laser bar, microcracks were observed in the laser bar, which indicates extremely high mechanical stresses. Stress calculations confirmed this. Cracks in the region of the active zones of laser diodes destroy these laser diodes.

According to one teaching (8), the mechanical stability of the bond can be increased by filling the V-grooves with solder. (8) However, it is not possible to prevent mechanical stresses in this way.

In practice, the problem of crack formation can be avoided by mounting individual laser diodes. (9) It is also obvious to mount laser diode groups, by which is meant a physical unit of a plurality of single laser diodes, typically two to five individual laser diodes. However, when mounting individual laser diodes or laser diode groups, alignment problems occur due to the small geometric dimensions. Further, the optical power density is reduced owing to the required intermediate spaces between the individual laser diodes or laser diode groups. Moreover, this considerably complicates manufacture.

OBJECT AND SUMMARY OF THE INVENTION

The primary object of the invention is to improve the performance of a high-power diode laser with a heat sink having a lower thermal expansion coefficient than the laser bar and to increase the life of the high-power diode laser.

This object is met with a high-power diode laser with a laser bar comprising a strip of semiconductor material which is divided optically-electrically into single laser diodes. A heat sink is included which has a substantially smaller expansion coefficient than the semiconductor material of the laser bar and is connected by solder with the laser bar on the p-side. A bonding communicates with the laser bar on the n-side. The solder connecting the laser bar with the heat sink is a solder with low ductility at room temperature (hard solder). The laser bar has breaks at determined intervals at defined locations between the single laser diodes after mounting, so that the laser diodes of the laser bar are physically separated from each other into at least one of individual laser diodes and laser diode groups so that there can be no transmission of mechanical stresses.

A method for mounting a high-power diode also contributes to meeting the stated object. The method for mounting a high-power laser diode with a laser bar comprises a strip of semiconductor material which is divided optically-electrically into single laser diodes, a heat sink which has a substantially smaller expansion coefficient than the semiconductor material of the laser bar and is connected by solder with the laser bar on the p-side, and a bonding which communicates with the laser bar on the n-side. The method comprises the steps of producing predetermined breaking locations at defined locations at determined intervals between the laser diodes, soldering the heat sink by solder with low ductility at room temperature (hard solder), rapidly cooling the laser bar soldered to the heat sink so that the laser bar breaks at the predetermined breaking locations, and applying bonding.

Significant to the invention is the creation of defined predetermined breaking locations in the laser bar which, during cooling after the laser bar has been soldered to a heat sink having a lower expansion coefficient, lead to breakage of the laser bar between the laser diodes and accordingly not in the active regions of the laser bar.

Accordingly, with respect to the mounting of the high-power diode laser, the advantages of a laser bar compared with individual laser diodes are fully realized, i.e., the laser bar is handier compared to individual laser diodes because of its size and needs to be adjusted only once as a whole.

With respect to function, on the other hand, the laser bar acts not only optically-electrically as is conventional as an arrangement of individual laser diodes, but also, with respect to stress engineering, acts as individual laser diodes or laser diode groups because of the breaks, which also results in a physical separation of the single laser diodes into individual laser diodes or laser diode groups. A possible crack formation in the active regions of the laser diode bar is thus avoided. The higher optical power density and better collimation of a laser bar compared with an arrangement of individual laser diodes remains unaffected. As a result of the physical division into individual laser diodes or laser diode groups, it is possible to use a solder for mounting which has low ductility (hard solder) at room temperature which could not previously be used for mounting laser bars with a typical width of 10 mm for the reasons discussed above.

In order to prevent damage to the active regions of the laser bar, the predetermined breaking locations are arranged, according to the invention, between the active regions, that is, between the single laser diodes of a bar. In laser bars with V-grooves commonly in use at the present time, the predetermined breaking locations are preferably arranged as an extension of the V-grooves. This can be effected on the p-side, on the n-side or on both sides or can also be effected when arranging the V-grooves themselves.

The predetermined breaking locations can be produced, for example, by reactive ion etching, anisotropic wet-chemical etching, laser beam machining, scribing or cutting. If necessary, the cross-sectional reduction of the laser bar occurring as a result of manufacture due to the V-grooves is itself sufficient to achieve predetermined breaking locations with the effect intended by the invention.

In order to meet the object according to the invention it is not absolutely necessary to physically separate all of the laser diodes of a bar from one another, i.e., to divide the laser bar into individual laser diodes. It is likewise possible to divide into laser diode groups. However, the spacing between the predetermined breaking locations should advantageously be no more than 2 mm.

It is necessary that the laser bar is cooled to room temperature relatively quickly after soldering to the heat sink, e.g., at a cooling rate of 40 K per minute, so that the predetermined breaking locations will break. This rapid cooling causes cracks at the predetermined breaking locations in the semiconductor material of the laser bar, since the thermally induced tensile stresses in the laser bar are in the order of magnitude of the tensile strength of the semiconductor material. The laser diode bar is accordingly separated into individual laser diodes or laser diode groups. Since the cracks spread into electrically and optically inactive regions of the semiconductor material, the cracks do not impair the function or performance of the high-power diode lasers.

It is advantageous to carry out a subsequent tempering process on the soldered laser bar so that mechanical stresses are reduced in the optically active regions. The flux (creep) of the solder occurring in so doing reduces mechanical stresses in the bond, which has a positive outcome for the electrooptical characteristics of the laser diodes and for their life and dependability. Unlike soft solder, the creep of hard solder such as AuSn is negligible at room temperature, but substantial at temperatures of roughly 200° C. (6)

It is advantageous when the laser bar is first soldered to the heat sink and, after suitable cooling which leads to breakage at the predetermined breaking locations, the tempering process is combined with the soldering process on the second side of the laser bar. This can be effected in such a way that the arrangement is heated to the soldering temperature of the n-side to connect the n-side and a cover, cooled preferably to 190° C., and held or stored, respectively, at this temperature for several minutes or hours. The longer the tempering period, the greater the reduction of mechanical stresses.

It is particularly advantageous when a slit cover is used on the n-side of the laser bar for bonding. For example, this prevents solder on the cover from penetrating into the cracks which occur in the laser bar during the first, quick cooling and damaging the semiconductor material.

The solution according to the invention has the advantage that the life and dependability factors known in the assembly or mounting of individual laser diodes can be achieved without having to forfeit the decisive advantages which can be achieved with laser bar mounting, such as high optical power density and fast, highly accurate adjustment. Another advantage of the solution according to the invention consists in the reduced sagging or bending of the construction which contributes to a reduction in so-called "smiles" of the high-power diode lasers.

BRIEF DESCRIPTION OF THE DRAWING

An advantageous embodiment form of a high-power diode lasers according to the invention is shown in FIG. 1. It is described in Embodiment Example 1.

DESCRIPTION OF THE PREFERRED EMBODIMENTS

EMBODIMENT EXAMPLE 1

Figure 1:
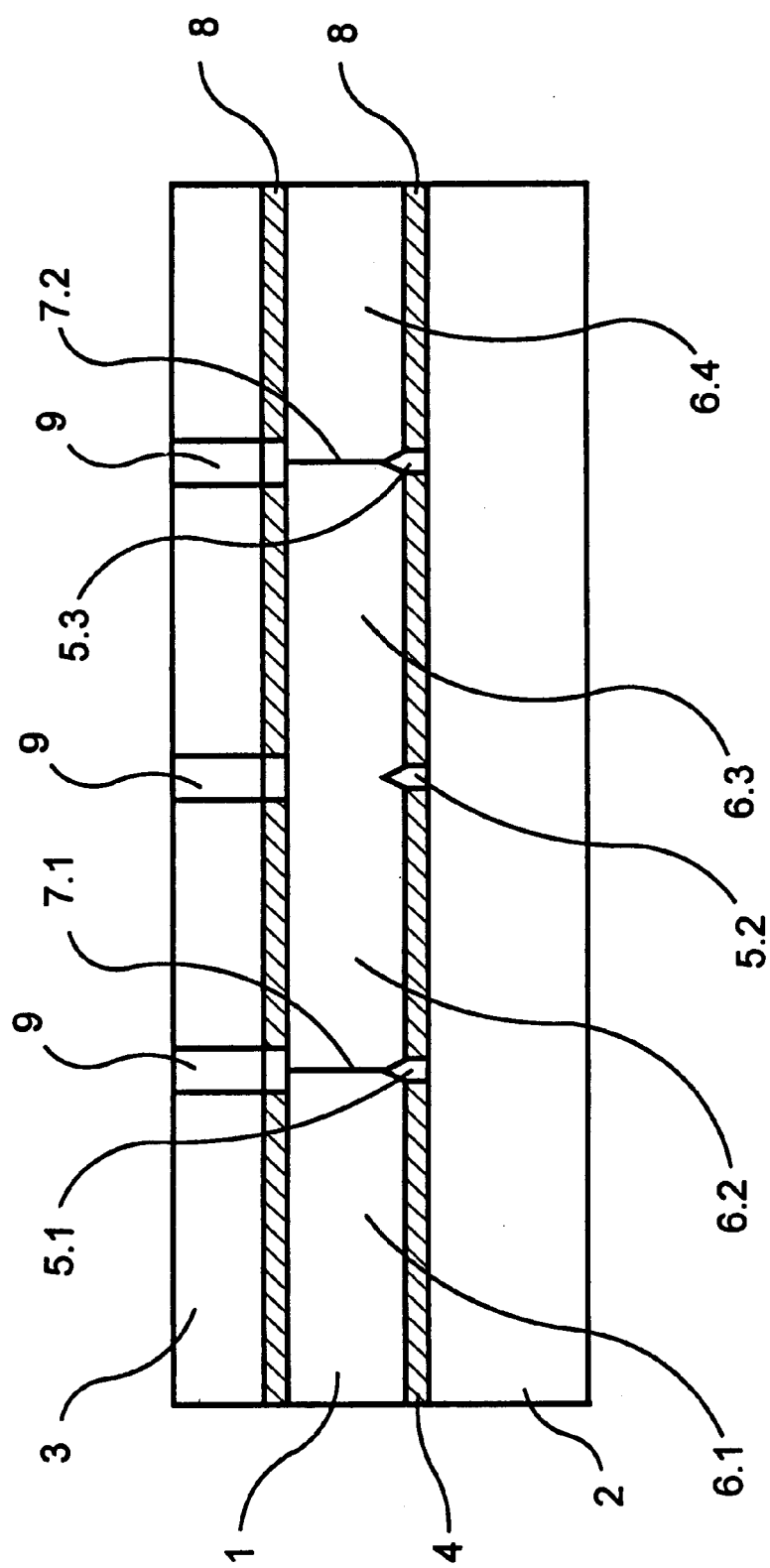

The high-power diode laser according to the invention shown in FIG. 1 is formed of a laser bar 1, a heat sink 2 which is a diamond soldered to a copper cooling block, not shown, and soldered on cover 3. The p-side 4 of the laser bar 1 is divided into single laser diodes 6.1; 6.2; 6.3; 6.4 by V-grooves 5.1; 5.2; 5.3. A first break line 7.1 extends between the first laser diode 6.1 and the second laser diode 6.2. A second breaking line 7.2 also passes between the third laser diode 6.3 and the fourth laser diode 6.4. Thus, the first laser diode 6.1 of the laser bar 1 is actually an individual laser diode, while the second and third laser diodes 6.2; 6.3 form a laser diode group. The laser bar 1 is connected with the heat sink on the p-side 4 by means of a gold-tin solder 8. The cover 3 has slits 9 at least in continuation of the breaking lines 7.1; 7.2.

The method according to the invention for mounting or assembling high-power diode lasers according to the invention will be explained more fully in the following with the aid of Embodiment Examples 1 to 8.

EMBODIMENT EXAMPLE 2A

In this embodiment example, the laser bar is machined by a laser beam on the p-side in the V-grooves which divide the p-side into a plurality of active regions acting optoelectrically as individual laser diodes, so that a local change in structure occurs, as does removal of material, as the case may be. The laser bar is then soldered by the n-side to a gold-plated copper cover with an approximately eutectic gold-tin solder. Subsequently, a heat sink, e.g., a metallized diamond, with a lower thermal expansion coefficient is soldered to the p-side of the laser bar with an approximately eutectic gold-tin solder and the arrangement is cooled to room temperature at a cooling rate of 40 K per minute. During this cooling process, strong tensile stresses occur in the laser bar and the regions machined by the laser beam act as predetermined breaking locations, proceeding from which cracks spread through the laser bar until the other side of the laser bar. In this way, the laser bar is divided into individual laser diodes or laser diode groups. The arrangement is subsequently heated, typically to 190° C., and stored at this temperature for one hour. In so doing, flux or creep of the solder occurs, which leads to a reduction of mechanical stresses in the arrangement.

EMBODIMENT EXAMPLE 3

In contrast to the second embodiment example, the predetermined breaking locations are produced already during the production of the laser bar in that the V-grooves are arranged on the p-side of the laser bar over a depth of, e.g., 20 μm (greater than the otherwise required depth for an optical and electrical division of the p-side), for example, by reactive ion etching. The approximately eutectic gold-tin solder is applied to the piece to be connected therewith by evaporation of a gold-tin multilayer system.

EMBODIMENT EXAMPLE 4

In a fourth embodiment example, the laser bar is provided on the n-side with notches of 25 μm depth at intervals of 2 mm by diamond cutting, these notches acting as predetermined breaking locations during cooling at a rate of 40 K per minute. The notches of 25 μm depth are arranged exactly opposite a V-groove. In other respects, the method steps correspond to those described in Embodiment Example 2.

EMBODIMENT EXAMPLE 5

In Embodiment Example 5, grooves are arranged at intervals of 2 mm on the n-side of the laser bar by anisotropic wet-chemical etching in such a way that each of these grooves is located exactly opposite a V-groove on the p-side. The laser bar is then soldered to a diamond heat sink provided with a gold-tin multilayer system and cooled to approximately 190° C. at 40 K per minute. As a result of the mechanical tensile stresses occurring during the cooling, microcracks occur at the channels on the n-side, which microcracks spread through the laser bar and divide the latter into individual laser diodes or laser diode groups. This arrangement is then tempered at approximately 190° C. for approximately one hour. Mechanical stresses are accordingly reduced in the semiconductor material. The cover is then soldered with a soft solder or electrical contact is made with the n-side by means of wire bonds.

EMBODIMENT EXAMPLE 6

This embodiment example is analogous to Embodiment Example 5, but the tempering process is carried out for one hour at approximately 190° C. in conjunction with the soldering of the cover. This is advantageous because a temperature treatment step is dispensed with.

EMBODIMENT EXAMPLE 7

This embodiment example can correspond to any one of the embodiment examples described above with respect to the process sequence. However, a slit cover is used which has the advantageous effect that no solder can enter the gaps from the cover during the soldering of the n-side. Damage to the semiconductor material is accordingly prevented,.

EMBODIMENT EXAMPLE 8

In this embodiment example, a diamond heat sink and the cover are connected and bonded simultaneously in a soldering process with the laser bar in one temperature cycle.

List of Citations (1) S. A. Merrit, P. J. S. Heim, S. Cho, and M. Dagenais, "A Reliable Die Attach Method for High Power Semiconductor Lasers and Optical Amplifiers," in Proceedings of the 45th Electronic Components and Technology Conference, Las Vegas, May 1995, pages 428–430;

(2) R. Beach, W. J. Benett, B. L. Freitas, D. Mundinger, B. J. Comaskey, R. W. Solarz, and M. A. Emanuel, "Modular Microchannel Cooled Heatsink for High Average Power Laser Diode Arrays, " IEEE Journal of Quantum Electronics, vol. 28, no. 4, April 1992, pages 966–976;

(3) M. Fukuda, "Reliability and Degradation of Semiconductor Lasers and LEDs", Artech House, Boston, London 1991, pages 309–317;

(4) C. C. Lee, C. Y. Wang and G. Matijasevic, "Advances in Bonding Technology for Electronic Packaging", Journal of Electronic Packaging, June 1993, vol. 115, page 201;

(5) C. D. Iacovangelo, R. A. Fillion, and J. F. Burgess: "Electronic Apparatus with Improved Thermal Expansion Match", WO 94/24703, Oct. 27, 1994;

(6) D. R. Olsen and H. M. Berg, "Properties of Die Bond Alloys Relating to Thermal Fatigue", IEEE Transactions on Components, Hybrids, and Manufacturing Technology, vol. CHMT-2, 1979, pages 257–263;

(7) H. Lowe and H. Lynn, "Real World Flip-Chip Assembly: A Manufacturer's Experience", in Proceedings SMI, 1995, pages 80–87;

(8) K. A. Baxter, "Apparatus and Method of Bonding Isolation Grooves of a Ridge Wave-Guide Laser Diode", U.S. Pat. No. 5,388,755, Feb. 14, 1995;

(9) S. Weiβ, E. Zakel, H. Reichl, "Mounting of High Power Laser Diodes on Diamond Heatsinks", Transactions on Components, Packaging and Manufacturing Technology, Part A, vol. 19, no. 1, March 1996, pages 46–47.

While the foregoing description and drawings represent the preferred embodiments of the present invention, it will be obvious to those skilled in the art that various changes and modifications may be made therein without departing from the true spirit and scope of the present invention.

What is claimed is:

1. A high-power diode laser with a laser bar, comprising:
   a strip of semiconductor material which is divided optically-electrically into single laser diodes;
   a heat sink having a substantially smaller expansion coefficient than the semiconductor material of the laser bar and is connected by solder with the laser bar on the p-side, and a bonding which communicates with the laser bar on the n-side;
   said solder connecting the laser bar with the heat sink being a solder with low ductility at room temperature (hard solder); and
   said laser bar having breaks at determined intervals at defined locations between the single laser diodes after mounting, so that the laser diodes of the laser bar are physically separated from each other into at least one of individual laser diodes and laser diode groups so that there can be no transmission of mechanical stresses.

2. The high-power diode laser according to claim 1, wherein the dividing of the semiconductor material is effected by means of V-grooves, wherein the breaks extend as continuations of the V-grooves.

3. The high-power diode laser according to claim 1, wherein the intervals between the breaks are smaller than 2 mm.

4. The high-power diode laser according to claim 1, wherein the solder contains gold and tin.

5. The high-power diode laser according to claim 1, wherein the solder is a multilayer system which results in a gold-tin multilayer solder alloy when soldering.

6. The high-power diode laser according to claim 1, wherein the bonding is a slit cover.

7. A method for mounting a high-power diode laser with a laser bar, comprising a strip of semiconductor material which is divided optically-electrically into single laser diodes, a heat sink which has a substantially smaller expansion coefficient than the semiconductor material of the laser bar and is connected by solder with the laser bar on the p-side, and a bonding which communicates with the laser bar on the n-side, said method including the following steps:

producing predetermined breaking locations at defined locations at determined intervals between the single laser diodes;

soldering the heat sink by solder with low ductility at room temperature (hard solder);

rapidly cooling the laser bar soldered to the heat sink so that the laser bar breaks at the predetermined breaking locations; and applying bonding.

8. The method according to claim 7, wherein the solder contains gold and tin.

9. The method according to claim 7, wherein the solder is applied as a multilayer system which gives a gold-tin solder in the resulting solder alloy when soldering.

10. The method according to claim 7, wherein, after producing the breaks, the laser bar is tempered, that is, to a temperature at which the solder flows, is then heated and held at least approximately at this temperature for several minutes to several hours, so that mechanical stresses are reduced.

11. The method according to claim 10, wherein the tempering is an integral component part of the cooling in that the cooling is interrupted at a temperature at which the solder is still flowing.

12. The method according to claim 7, wherein the predetermined breaking locations are produced by laser beam machining.

13. The method according to claim 7, wherein the predetermined breaking locations are produced by reactive ion etching.

14. The method according to claim 7, wherein the predetermined breaking locations are produced by scribing.

15. The method according to claim 7, wherein the predetermined breaking locations are produced by wet-chemical etching.

16. The method according to claim 7, wherein the predetermined breaking locations are produced by cutting.

17. The method according to claim 7, wherein the predetermined breaking locations are produced already during the production of the laser bar in that the V-grooves are made deeper than is required for their actual function.

18. The method according to claim 7, wherein cooling to at least 190° C. is effected at a rate of at least 40 K per minute.

\* \* \* \* \*